United States Patent
Wood

[19]

[11] Patent Number: 6,147,629
[45] Date of Patent: Nov. 14, 2000

[54] METHOD AND APPARATUS FOR VARIABLE LENGTH DECODING

[75] Inventor: Stephen Vincent Wood, Hillsboro, Oreg.

[73] Assignee: Intel Corporation, Santa Clara, Calif.

[21] Appl. No.: 09/172,683

[22] Filed: Oct. 15, 1998

[51] Int. Cl.[7] .................................................. H03M 7/40
[52] U.S. Cl. ................................................................ 341/67
[58] Field of Search .............................. 341/65, 67, 106

[56] References Cited

U.S. PATENT DOCUMENTS

| | | | |
|---|---|---|---|
| 5,648,775 | 7/1997 | Kim | 341/67 |
| 5,663,725 | 9/1997 | Jang | 341/67 |
| 5,831,557 | 11/1998 | Handley | 341/67 |
| 5,949,356 | 9/1999 | Kim et al. | 341/67 |

Primary Examiner—Trong Phan
Attorney, Agent, or Firm—Kenyon & Kenyon

[57] ABSTRACT

A method and apparatus for decoding variable length encoded signals is described. A decoder receives an encoded bitstream. The decoder retrieves N bits from the bitstream. The decoder retrieves a first value from a first table using the N bits. The decoder retrieves a second value from a second table using the first value, and determines whether the second value is a valid code. If the second value is a valid code, the decoder parses the second value to retrieve a run value, an amp value and a code length value.

18 Claims, 11 Drawing Sheets

TABLE 1

| pcode | index | pcode | index | pcode | index | pcode | index | pcode | index | pcode | index | pcode | index | pcode | index |
|---|---|---|---|---|---|---|---|---|---|---|---|---|---|---|---|
| 0 | 0 | 128 | 1 | 256 | 2 | 384 | 4 | 512 | 7 | 640 | 11 | 768 | 19 | 896 | 43 |
| 1 | 0 | 129 | 1 | 257 | 2 | 385 | 4 | 513 | 7 | 641 | 11 | 769 | 19 | 897 | 43 |
| 2 | 0 | 130 | 1 | 258 | 2 | 386 | 4 | 514 | 7 | 642 | 11 | 770 | 19 | 898 | 44 |
| 3 | 0 | 131 | 1 | 259 | 2 | 387 | 4 | 515 | 7 | 643 | 11 | 771 | 19 | 899 | 44 |
| 4 | 0 | 132 | 1 | 260 | 2 | 388 | 4 | 516 | 7 | 644 | 11 | 772 | 19 | 900 | 45 |
| 5 | 0 | 133 | 1 | 261 | 2 | 389 | 4 | 517 | 7 | 645 | 11 | 773 | 19 | 901 | 45 |
| 6 | 0 | 134 | 1 | 262 | 2 | 390 | 4 | 518 | 7 | 646 | 11 | 774 | 19 | 902 | 46 |
| 7 | 0 | 135 | 1 | 263 | 2 | 391 | 4 | 519 | 7 | 647 | 11 | 775 | 19 | 903 | 46 |
| 8 | 0 | 136 | 1 | 264 | 2 | 392 | 4 | 520 | 7 | 648 | 11 | 776 | 20 | 904 | 47 |
| 9 | 0 | 137 | 1 | 265 | 2 | 393 | 4 | 521 | 7 | 649 | 11 | 777 | 20 | 905 | 47 |
| 10 | 0 | 138 | 1 | 266 | 2 | 394 | 4 | 522 | 7 | 650 | 11 | 778 | 20 | 906 | 48 |
| 11 | 0 | 139 | 1 | 267 | 2 | 395 | 4 | 523 | 7 | 651 | 11 | 779 | 20 | 907 | 48 |
| 12 | 0 | 140 | 1 | 268 | 2 | 396 | 4 | 524 | 7 | 652 | 11 | 780 | 20 | 908 | 49 |
| 13 | 0 | 141 | 1 | 269 | 2 | 397 | 4 | 525 | 7 | 653 | 11 | 781 | 20 | 909 | 49 |
| 14 | 0 | 142 | 1 | 270 | 2 | 398 | 4 | 526 | 7 | 654 | 11 | 782 | 20 | 910 | 50 |
| 15 | 0 | 143 | 1 | 271 | 2 | 399 | 4 | 527 | 7 | 655 | 11 | 783 | 20 | 911 | 50 |
| 16 | 0 | 144 | 1 | 272 | 2 | 400 | 4 | 528 | 7 | 656 | 12 | 784 | 21 | 912 | 51 |
| 17 | 0 | 145 | 1 | 273 | 2 | 401 | 4 | 529 | 7 | 657 | 12 | 785 | 21 | 913 | 51 |
| 18 | 0 | 146 | 1 | 274 | 2 | 402 | 4 | 530 | 7 | 658 | 12 | 786 | 21 | 914 | 52 |
| 19 | 0 | 147 | 1 | 275 | 2 | 403 | 4 | 531 | 7 | 659 | 12 | 787 | 21 | 915 | 52 |
| 20 | 0 | 148 | 1 | 276 | 2 | 404 | 4 | 532 | 7 | 660 | 12 | 788 | 21 | 916 | 53 |
| 21 | 0 | 149 | 1 | 277 | 2 | 405 | 4 | 533 | 7 | 661 | 12 | 789 | 21 | 917 | 53 |
| 22 | 0 | 150 | 1 | 278 | 2 | 406 | 4 | 534 | 7 | 662 | 12 | 790 | 21 | 918 | 54 |
| 23 | 0 | 151 | 1 | 279 | 2 | 407 | 4 | 535 | 7 | 663 | 12 | 791 | 21 | 919 | 54 |
| 24 | 0 | 152 | 1 | 280 | 2 | 408 | 4 | 536 | 7 | 664 | 12 | 792 | 22 | 920 | 55 |

FIG. 3A

TABLE 1 (cont.)

| pcode | index | pcode | index | pcode | index | pcode | index | pcode | index | pcode | index | pcode | index | pcode | index |
|---|---|---|---|---|---|---|---|---|---|---|---|---|---|---|---|
| 25 | 0 | 153 | 1 | 281 | 2 | 409 | 4 | 537 | 7 | 665 | 12 | 793 | 22 | 921 | 55 |
| 26 | 0 | 154 | 1 | 282 | 2 | 410 | 4 | 538 | 7 | 666 | 12 | 794 | 22 | 922 | 56 |
| 27 | 0 | 155 | 1 | 283 | 2 | 411 | 4 | 539 | 7 | 667 | 12 | 795 | 22 | 923 | 56 |
| 28 | 0 | 156 | 1 | 284 | 2 | 412 | 4 | 540 | 7 | 668 | 12 | 796 | 22 | 924 | 57 |
| 29 | 0 | 157 | 1 | 285 | 2 | 413 | 4 | 541 | 7 | 669 | 12 | 797 | 22 | 925 | 57 |
| 30 | 0 | 158 | 1 | 286 | 2 | 414 | 4 | 542 | 7 | 670 | 12 | 798 | 22 | 926 | 58 |
| 31 | 0 | 159 | 1 | 287 | 2 | 415 | 4 | 543 | 7 | 671 | 12 | 799 | 22 | 927 | 58 |
| 32 | 0 | 160 | 1 | 288 | 2 | 416 | 4 | 544 | 8 | 672 | 13 | 800 | 23 | 928 | 59 |
| 33 | 0 | 161 | 1 | 289 | 2 | 417 | 4 | 545 | 8 | 673 | 13 | 801 | 23 | 929 | 59 |
| 34 | 0 | 162 | 1 | 290 | 2 | 418 | 4 | 546 | 8 | 674 | 13 | 802 | 23 | 930 | 60 |
| 35 | 0 | 163 | 1 | 291 | 2 | 419 | 4 | 547 | 8 | 675 | 13 | 803 | 23 | 931 | 60 |
| 36 | 0 | 164 | 1 | 292 | 2 | 420 | 4 | 548 | 8 | 676 | 13 | 804 | 23 | 932 | 61 |
| 37 | 0 | 165 | 1 | 293 | 2 | 421 | 4 | 549 | 8 | 677 | 13 | 805 | 23 | 933 | 61 |
| 38 | 0 | 166 | 1 | 294 | 2 | 422 | 4 | 550 | 8 | 678 | 13 | 806 | 23 | 934 | 62 |
| 39 | 0 | 167 | 1 | 295 | 2 | 423 | 4 | 551 | 8 | 679 | 13 | 807 | 23 | 935 | 62 |
| 40 | 0 | 168 | 1 | 296 | 2 | 424 | 4 | 552 | 8 | 680 | 13 | 808 | 23 | 936 | 63 |
| 41 | 0 | 169 | 1 | 297 | 2 | 425 | 4 | 553 | 8 | 681 | 13 | 809 | 23 | 937 | 63 |
| 42 | 0 | 170 | 1 | 298 | 2 | 426 | 4 | 554 | 8 | 682 | 13 | 810 | 23 | 938 | 64 |
| 43 | 0 | 171 | 1 | 299 | 2 | 427 | 4 | 555 | 8 | 683 | 13 | 811 | 24 | 939 | 64 |
| 44 | 0 | 172 | 1 | 300 | 2 | 428 | 4 | 556 | 8 | 684 | 13 | 812 | 24 | 940 | 65 |
| 45 | 0 | 173 | 1 | 301 | 2 | 429 | 4 | 557 | 8 | 685 | 13 | 813 | 24 | 941 | 65 |
| 46 | 0 | 174 | 1 | 302 | 2 | 430 | 4 | 558 | 8 | 686 | 13 | 814 | 24 | 942 | 66 |
| 47 | 0 | 175 | 1 | 303 | 2 | 431 | 4 | 559 | 8 | 687 | 13 | 815 | 24 | 943 | 66 |
| 48 | 0 | 176 | 1 | 304 | 2 | 432 | 4 | 560 | 8 | 688 | 14 | 816 | 25 | 944 | 67 |
| 49 | 0 | 177 | 1 | 305 | 2 | 433 | 4 | 561 | 8 | 689 | 14 | 817 | 25 | 945 | 67 |

FIG. 3B

TABLE 1 (cont.)

| pcode | index | pcode | index | pcode | index | pcode | index | pcode | index | pcode | index | pcode | index | pcode | index |
|---|---|---|---|---|---|---|---|---|---|---|---|---|---|---|---|
| 50 | 0 | 178 | 1 | 306 | 2 | 434 | 4 | 562 | 8 | 690 | 14 | 818 | 25 | 946 | 68 |
| 51 | 0 | 179 | 1 | 307 | 2 | 435 | 4 | 563 | 8 | 691 | 14 | 819 | 25 | 947 | 68 |
| 52 | 0 | 180 | 1 | 308 | 2 | 436 | 4 | 564 | 8 | 692 | 14 | 820 | 25 | 948 | 69 |
| 53 | 0 | 181 | 1 | 309 | 2 | 437 | 4 | 565 | 8 | 693 | 14 | 821 | 25 | 949 | 69 |
| 54 | 0 | 182 | 1 | 310 | 2 | 438 | 4 | 566 | 8 | 694 | 14 | 822 | 25 | 950 | 70 |
| 55 | 0 | 183 | 1 | 311 | 2 | 439 | 4 | 567 | 8 | 695 | 14 | 823 | 25 | 951 | 70 |
| 56 | 0 | 184 | 1 | 312 | 2 | 440 | 4 | 568 | 8 | 696 | 14 | 824 | 26 | 952 | 71 |
| 57 | 0 | 185 | 1 | 313 | 2 | 441 | 4 | 569 | 8 | 697 | 14 | 825 | 26 | 953 | 71 |
| 58 | 0 | 186 | 1 | 314 | 2 | 442 | 4 | 570 | 8 | 698 | 14 | 826 | 26 | 954 | 72 |
| 59 | 0 | 187 | 1 | 315 | 2 | 443 | 4 | 571 | 8 | 699 | 14 | 827 | 26 | 955 | 72 |
| 60 | 0 | 188 | 1 | 316 | 2 | 444 | 4 | 572 | 8 | 700 | 14 | 828 | 26 | 956 | 73 |
| 61 | 0 | 189 | 1 | 317 | 2 | 445 | 4 | 573 | 8 | 701 | 14 | 829 | 26 | 957 | 73 |
| 62 | 0 | 190 | 1 | 318 | 2 | 446 | 4 | 574 | 8 | 702 | 14 | 830 | 26 | 958 | 74 |
| 63 | 0 | 191 | 1 | 319 | 2 | 447 | 4 | 575 | 8 | 703 | 14 | 831 | 26 | 959 | 74 |
| 64 | 0 | 192 | 1 | 320 | 3 | 448 | 5 | 576 | 9 | 704 | 15 | 832 | 27 | 960 | 75 |
| 65 | 0 | 193 | 1 | 321 | 3 | 449 | 5 | 577 | 9 | 705 | 15 | 833 | 27 | 961 | 76 |
| 66 | 0 | 194 | 1 | 322 | 3 | 450 | 5 | 578 | 9 | 706 | 15 | 834 | 27 | 962 | 77 |
| 67 | 0 | 195 | 1 | 323 | 3 | 451 | 5 | 579 | 9 | 707 | 15 | 835 | 27 | 963 | 78 |
| 68 | 0 | 196 | 1 | 324 | 3 | 452 | 5 | 580 | 9 | 708 | 15 | 836 | 28 | 964 | 79 |
| 69 | 0 | 197 | 1 | 325 | 3 | 453 | 5 | 581 | 9 | 709 | 15 | 837 | 28 | 965 | 80 |
| 70 | 0 | 198 | 1 | 326 | 3 | 454 | 5 | 582 | 9 | 710 | 15 | 838 | 28 | 966 | 81 |
| 71 | 0 | 199 | 1 | 327 | 3 | 455 | 5 | 583 | 9 | 711 | 15 | 839 | 28 | 967 | 82 |
| 72 | 0 | 200 | 1 | 328 | 3 | 456 | 5 | 584 | 9 | 712 | 15 | 840 | 29 | 968 | 83 |
| 73 | 0 | 201 | 1 | 329 | 3 | 457 | 5 | 585 | 9 | 713 | 15 | 841 | 29 | 969 | 84 |
| 74 | 0 | 202 | 1 | 330 | 3 | 458 | 5 | 586 | 9 | 714 | 15 | 842 | 29 | 970 | 85 |

FIG. 3C

TABLE 1 (cont.)

| pcode | index | pcode | index | pcode | index | pcode | index | pcode | index | pcode | index |
|---|---|---|---|---|---|---|---|---|---|---|---|
| 75 | 0 | 203 | 1 | 331 | 3 | 459 | 5 | 587 | 9 | 715 | 15 | 843 | 29 | 971 | 86 |
| 76 | 0 | 204 | 1 | 332 | 3 | 460 | 5 | 588 | 9 | 716 | 15 | 844 | 30 | 972 | 87 |
| 77 | 0 | 205 | 1 | 333 | 3 | 461 | 5 | 589 | 9 | 717 | 15 | 845 | 30 | 973 | 88 |
| 78 | 0 | 206 | 1 | 334 | 3 | 462 | 5 | 590 | 9 | 718 | 15 | 846 | 30 | 974 | 89 |
| 79 | 0 | 207 | 1 | 335 | 3 | 463 | 5 | 591 | 9 | 719 | 15 | 847 | 30 | 975 | 90 |
| 80 | 0 | 208 | 1 | 336 | 3 | 464 | 5 | 592 | 9 | 720 | 16 | 848 | 31 | 976 | 91 |
| 81 | 0 | 209 | 1 | 337 | 3 | 465 | 5 | 593 | 9 | 721 | 16 | 849 | 31 | 977 | 92 |
| 82 | 0 | 210 | 1 | 338 | 3 | 466 | 5 | 594 | 9 | 722 | 16 | 850 | 31 | 978 | 93 |
| 83 | 0 | 211 | 1 | 339 | 3 | 467 | 5 | 595 | 9 | 723 | 16 | 851 | 31 | 979 | 94 |
| 84 | 0 | 212 | 1 | 340 | 3 | 468 | 5 | 596 | 9 | 724 | 16 | 852 | 32 | 980 | 95 |
| 85 | 0 | 213 | 1 | 341 | 3 | 469 | 5 | 597 | 9 | 725 | 16 | 853 | 32 | 981 | 96 |
| 86 | 0 | 214 | 1 | 342 | 3 | 470 | 5 | 598 | 9 | 726 | 16 | 854 | 32 | 982 | 97 |
| 87 | 0 | 215 | 1 | 343 | 3 | 471 | 5 | 599 | 9 | 727 | 16 | 855 | 32 | 983 | 98 |
| 88 | 0 | 216 | 1 | 344 | 3 | 472 | 5 | 600 | 9 | 728 | 16 | 856 | 33 | 984 | 99 |
| 89 | 0 | 217 | 1 | 345 | 3 | 473 | 5 | 601 | 9 | 729 | 16 | 857 | 33 | 985 | 100 |
| 90 | 0 | 218 | 1 | 346 | 3 | 474 | 5 | 602 | 9 | 730 | 16 | 858 | 33 | 986 | 101 |
| 91 | 0 | 219 | 1 | 347 | 3 | 475 | 5 | 603 | 9 | 731 | 16 | 859 | 33 | 987 | 102 |
| 92 | 0 | 220 | 1 | 348 | 3 | 476 | 5 | 604 | 9 | 732 | 16 | 860 | 34 | 988 | 103 |
| 93 | 0 | 221 | 1 | 349 | 3 | 477 | 5 | 605 | 9 | 733 | 16 | 861 | 34 | 989 | 104 |
| 94 | 0 | 222 | 1 | 350 | 3 | 478 | 5 | 606 | 9 | 734 | 16 | 862 | 34 | 990 | 105 |
| 95 | 0 | 223 | 1 | 351 | 3 | 479 | 5 | 607 | 9 | 735 | 16 | 863 | 34 | 991 | 106 |
| 96 | 0 | 224 | 1 | 352 | 3 | 480 | 6 | 608 | 10 | 736 | 17 | 864 | 35 | 992 | 107 |
| 97 | 0 | 225 | 1 | 353 | 3 | 481 | 6 | 609 | 10 | 737 | 17 | 865 | 35 | 993 | 107 |
| 98 | 0 | 226 | 1 | 354 | 3 | 482 | 6 | 610 | 10 | 738 | 17 | 866 | 35 | 994 | 107 |
| 99 | 0 | 227 | 1 | 355 | 3 | 483 | 6 | 611 | 10 | 739 | 17 | 867 | 35 | 995 | 107 |

FIG.3D

TABLE 1 (cont.)

| pcode | index | pcode | index | pcode | index | pcode | index | pcode | index | pcode | index | pcode | index |
|---|---|---|---|---|---|---|---|---|---|---|---|---|---|
| 100 | 0 | 228 | 1 | 356 | 3 | 484 | 6 | 612 | 10 | 740 | 17 | 868 | 36 | 996 | 107 |
| 101 | 0 | 229 | 1 | 357 | 3 | 485 | 6 | 613 | 10 | 741 | 17 | 869 | 36 | 997 | 107 |
| 102 | 0 | 230 | 1 | 358 | 3 | 486 | 6 | 614 | 10 | 742 | 17 | 870 | 36 | 998 | 107 |
| 103 | 0 | 231 | 1 | 359 | 3 | 487 | 6 | 615 | 10 | 743 | 17 | 871 | 36 | 999 | 107 |
| 104 | 0 | 232 | 1 | 360 | 3 | 488 | 6 | 616 | 10 | 744 | 17 | 872 | 37 | 1000 | 107 |
| 105 | 0 | 233 | 1 | 361 | 3 | 489 | 6 | 617 | 10 | 745 | 17 | 873 | 37 | 1001 | 107 |
| 106 | 0 | 234 | 1 | 362 | 3 | 490 | 6 | 618 | 10 | 746 | 17 | 874 | 37 | 1002 | 107 |
| 107 | 0 | 235 | 1 | 363 | 3 | 491 | 6 | 619 | 10 | 747 | 17 | 875 | 37 | 1003 | 107 |
| 108 | 0 | 236 | 1 | 364 | 3 | 492 | 6 | 620 | 10 | 748 | 17 | 876 | 38 | 1004 | 107 |
| 109 | 0 | 237 | 1 | 365 | 3 | 493 | 6 | 621 | 10 | 749 | 17 | 877 | 38 | 1005 | 107 |
| 110 | 0 | 238 | 1 | 366 | 3 | 494 | 6 | 622 | 10 | 750 | 17 | 878 | 38 | 1006 | 107 |
| 111 | 0 | 239 | 1 | 367 | 3 | 495 | 6 | 623 | 10 | 751 | 17 | 879 | 38 | 1007 | 107 |
| 112 | 0 | 240 | 1 | 368 | 3 | 496 | 6 | 624 | 10 | 752 | 18 | 880 | 39 | 1008 | 107 |
| 113 | 0 | 241 | 1 | 369 | 3 | 497 | 6 | 625 | 10 | 753 | 18 | 881 | 39 | 1009 | 107 |
| 114 | 0 | 242 | 1 | 370 | 3 | 498 | 6 | 626 | 10 | 754 | 18 | 882 | 39 | 1010 | 107 |
| 115 | 0 | 243 | 1 | 371 | 3 | 499 | 6 | 627 | 10 | 755 | 18 | 883 | 39 | 1011 | 107 |
| 116 | 0 | 244 | 1 | 372 | 3 | 500 | 6 | 628 | 10 | 756 | 18 | 884 | 40 | 1012 | 107 |
| 117 | 0 | 245 | 1 | 373 | 3 | 501 | 6 | 629 | 10 | 757 | 18 | 885 | 40 | 1013 | 107 |
| 118 | 0 | 246 | 1 | 374 | 3 | 502 | 6 | 630 | 10 | 758 | 18 | 886 | 40 | 1014 | 107 |
| 119 | 0 | 247 | 1 | 375 | 3 | 503 | 6 | 631 | 10 | 759 | 18 | 887 | 40 | 1015 | 107 |
| 120 | 0 | 248 | 1 | 376 | 3 | 504 | 6 | 632 | 10 | 760 | 18 | 888 | 41 | 1016 | 107 |
| 121 | 0 | 249 | 1 | 377 | 3 | 505 | 6 | 633 | 10 | 761 | 18 | 889 | 41 | 1017 | 107 |
| 122 | 0 | 250 | 1 | 378 | 3 | 506 | 6 | 634 | 10 | 762 | 18 | 890 | 41 | 1018 | 107 |
| 123 | 0 | 251 | 1 | 379 | 3 | 507 | 6 | 635 | 10 | 763 | 18 | 891 | 41 | 1019 | 107 |
| 124 | 0 | 252 | 1 | 380 | 3 | 508 | 6 | 636 | 10 | 764 | 18 | 892 | 42 | 1020 | 107 |
| 125 | 0 | 253 | 1 | 381 | 3 | 509 | 6 | 637 | 10 | 765 | 18 | 893 | 42 | 1021 | 107 |
| 126 | 0 | 254 | 1 | 382 | 3 | 510 | 6 | 638 | 10 | 766 | 18 | 894 | 42 | 1022 | 107 |
| 127 | 0 | 255 | 1 | 383 | 3 | 511 | 6 | 639 | 10 | 767 | 18 | 895 | 42 | 1023 | 107 |

FIG. 3E

TABLE 2

| index | RAB | Amp/Run/Bits | index | RAB | Amp/Run/Bits | index | RAB | Amp/Run/Bits |
|---|---|---|---|---|---|---|---|---|
| 0 | 00010003 | 1/ 0/ 3 | 27 | 00010508 | 1/ 5/ 8 | 54 | fffe0409 | -2/ 4/ 9 | 
| 1 | ffff0003 | -1/ 0/ 3 | 28 | ffff0508 | -1/ 5/ 8 | 55 | 00030209 | 3/ 2/ 9 |
| 2 | 00020004 | 2/ 0/ 4 | 29 | 00010608 | 1/ 6/ 8 | 56 | fffd0209 | -3/ 2/ 9 |
| 3 | fffe0004 | -2/ 0/ 4 | 30 | ffff0608 | -1/ 6/ 8 | 57 | 00050109 | 5/ 1/ 9 |
| 4 | 0000ff04 | 0/255/ 4 | 31 | 00020208 | 2/ 2/ 8 | 58 | fffb0109 | -5/ 1/ 9 |
| 5 | 00010105 | 1/ 1/ 5 | 32 | fffe0208 | -2/ 2/ 8 | 59 | 00060109 | 6/ 1/ 9 |
| 6 | ffff0105 | -1/ 1/ 5 | 33 | 00030108 | 3/ 1/ 8 | 60 | fffa0109 | -6/ 1/ 9 |
| 7 | 00030005 | 3/ 0/ 5 | 34 | fffd0108 | -3/ 1/ 8 | 61 | 00070109 | 7/ 1/ 9 |
| 8 | fffd0005 | -3/ 0/ 5 | 35 | 00040108 | 4/ 1/ 8 | 62 | fff90109 | -7/ 1/ 9 |
| 9 | 00040005 | 4/ 0/ 5 | 36 | fffc0108 | -4/ 1/ 8 | 63 | 000c0009 | 12/ 0/ 9 |
| 10 | fffc0005 | -4/ 0/ 5 | 37 | 00090008 | 9/ 0/ 8 | 64 | fff40009 | -12/ 0/ 9 |
| 11 | 00010206 | 1/ 2/ 6 | 38 | fff70008 | -9/ 0/ 8 | 65 | 000d0009 | 13/ 0/ 9 |
| 12 | ffff0206 | -1/ 2/ 6 | 39 | 000a0008 | 10/ 0/ 8 | 66 | fff30009 | -13/ 0/ 9 |
| 13 | 00020106 | 2/ 1/ 6 | 40 | fff60008 | -10/ 0/ 8 | 67 | 000e0009 | 14/ 0/ 9 |
| 14 | fffe0106 | -2/ 1/ 6 | 41 | 000b0008 | 11/ 0/ 8 | 68 | fff20009 | -14/ 0/ 9 |
| 15 | 00050006 | 5/ 0/ 6 | 42 | fff50008 | -11/ 0/ 8 | 69 | 000f0009 | 15/ 0/ 9 |
| 16 | fffb0006 | -5/ 0/ 6 | 43 | 00010709 | 1/ 7/ 9 | 70 | fff10009 | -15/ 0/ 9 |
| 17 | 00060006 | 6/ 0/ 6 | 44 | ffff0709 | -1/ 7/ 9 | 71 | 00100009 | 16/ 0/ 9 |
| 18 | fffa0006 | -6/ 0/ 6 | 45 | 00010809 | 1/ 8/ 9 | 72 | fff00009 | -16/ 0/ 9 |
| 19 | 00010307 | 1/ 3/ 7 | 46 | ffff0809 | -1/ 8/ 9 | 73 | 00110009 | 17/ 0/ 9 |
| 20 | ffff0307 | -1/ 3/ 7 | 47 | 00010909 | 1/ 9/ 9 | 74 | ffef0009 | -17/ 0/ 9 |
| 21 | 00010407 | 1/ 4/ 7 | 48 | ffff0909 | -1/ 9/ 9 | 75 | 00010b0a | 1/ 11/10 |
| 22 | ffff0407 | -1/ 4/ 7 | 49 | 00010a09 | 1/ 10/ 9 | 76 | ffff0b0a | -1/ 11/10 |
| 23 | 00070007 | 7/ 0/ 7 | 50 | ffff0a09 | -1/ 10/ 9 | 77 | 00010c0a | 1/ 12/10 |
| 24 | fff90007 | -7/ 0/ 7 | 51 | 00020309 | 2/ 3/ 9 | 78 | ffff0c0a | -1/ 12/10 |
| 25 | 00080007 | 8/ 0/ 7 | 52 | fffe0309 | -2/ 3/ 9 | 79 | 00010d0a | 1/ 13/10 |
| 26 | fff80007 | -8/ 0/ 7 | 53 | 00020409 | 2/ 4/ 9 | 80 | ffff0d0a | -1/ 13/10 |
| | | | | | | 81 | 00010e0a | 1/ 14/10 |
| | | | | | | 82 | ffff0e0a | -1/ 14/10 |
| | | | | | | 83 | 0002050a | 2/ 5/10 |
| | | | | | | 84 | fffe050a | -2/ 5/10 |
| | | | | | | 85 | 0002060a | 2/ 6/10 |
| | | | | | | 86 | fffe060a | -2/ 6/10 |
| | | | | | | 87 | 0003030a | 3/ 3/10 |
| | | | | | | 88 | fffd030a | -3/ 3/10 |
| | | | | | | 89 | 0003040a | 3/ 4/10 |
| | | | | | | 90 | fffd040a | -3/ 4/10 |
| | | | | | | 91 | 0004020a | 4/ 2/10 |
| | | | | | | 92 | fffc020a | -4/ 2/10 |
| | | | | | | 93 | 0005020a | 5/ 2/10 |
| | | | | | | 94 | fffb020a | -5/ 2/10 |
| | | | | | | 95 | 0008010a | 8/ 1/10 |
| | | | | | | 96 | fff8010a | -8/ 1/10 |
| | | | | | | 97 | 0012000a | 18/ 0/10 |
| | | | | | | 98 | ffee000a | -18/ 0/10 |
| | | | | | | 99 | 0013000a | 19/ 0/10 |
| | | | | | | 100 | ffed000a | -19/ 0/10 |
| | | | | | | 101 | 0014000a | 20/ 0/10 |
| | | | | | | 102 | ffec000a | -20/ 0/10 |
| | | | | | | 103 | 0015000a | 21/ 0/10 |
| | | | | | | 104 | ffeb000a | -21/ 0/10 |
| | | | | | | 105 | 0016000a | 22/ 0/10 |
| | | | | | | 106 | ffea000a | -22/ 0/10 |
| | | | | | | 107 | 00000000 | 0/ 0/ 0 |

FIG.4

TABLE 3

| index | RAB | Amp/Run/Bits | index | RAB | Amp/Run/Bits | index | RAB | Amp/Run/Bits |
|---|---|---|---|---|---|---|---|---|
| 0 | 0003050b | 3/ 5/11 | 64 | 0003060c | 3/ 6/12 | 128 | 00000000 | 0/ 0/ 0 |
| 1 | 0003050b | 3/ 5/11 | 65 | 0003060c | 3/ 6/12 | 129 | 00000000 | 0/ 0/ 0 |
| 2 | 0003050b | 3/ 5/11 | 66 | fffd060c | -3/ 6/12 | 130 | 00000000 | 0/ 0/ 0 |
| 3 | 0003050b | 3/ 5/11 | 67 | fffd060c | -3/ 6/12 | 131 | 00000000 | 0/ 0/ 0 |
| 4 | fffd050b | -3/ 5/11 | 68 | 0004040c | 4/ 4/12 | 132 | 00000000 | 0/ 0/ 0 |
| 5 | fffd050b | -3/ 5/11 | 69 | 0004040c | 4/ 4/12 | 133 | 00000000 | 0/ 0/ 0 |
| 6 | fffd050b | -3/ 5/11 | 70 | fffc040c | -4/ 4/12 | 134 | 00000060d | 0/ 6/13 |
| 7 | fffd050b | -3/ 5/11 | 71 | fffc040c | -4/ 4/12 | 135 | 00000070d | 0/ 7/13 |
| 8 | 0004030b | 4/ 3/11 | 72 | 0006030c | 6/ 3/12 | 136 | 00000080d | 0/ 8/13 |
| 9 | 0004030b | 4/ 3/11 | 73 | 0006030c | 6/ 3/12 | 137 | 00000090d | 0/ 9/13 |
| 10 | 0004030b | 4/ 3/11 | 74 | fffa030c | -6/ 3/12 | 138 | 000000a0d | 0/10/13 |
| 11 | 0004030b | 4/ 3/11 | 75 | fffa030c | -6/ 3/12 | 139 | 000000b0d | 0/11/13 |
| 12 | fffc030b | -4/ 3/11 | 76 | 000c010c | 12/ 1/12 | 140 | 000000c0d | 0/12/13 |
| 13 | fffc030b | -4/ 3/11 | 77 | 000c010c | 12/ 1/12 | 141 | 000000d0d | 0/13/13 |
| 14 | fffc030b | -4/ 3/11 | 78 | fff4010c | -12/ 1/12 | 142 | 000000e0d | 0/14/13 |
| 15 | fffc030b | -4/ 3/11 | 79 | fff4010c | -12/ 1/12 | 143 | 000000f0d | 0/15/13 |
| 16 | 0005030b | 5/ 3/11 | 80 | 000d010c | 13/ 1/12 | 144 | 0001000d | 0/16/13 |
| 17 | 0005030b | 5/ 3/11 | 81 | 000d010c | 13/ 1/12 | 145 | 0001100d | 0/17/13 |
| 18 | 0005030b | 5/ 3/11 | 82 | fff3010c | -13/ 1/12 | 146 | 0001200d | 0/18/13 |
| 19 | 0005030b | 5/ 3/11 | 83 | fff3010c | -13/ 1/12 | 147 | 0001300d | 0/19/13 |
| 20 | fffb030b | -5/ 3/11 | 84 | 000e010c | 14/ 1/12 | 148 | 0001400d | 0/20/13 |
| 21 | fffb030b | -5/ 3/11 | 85 | 000e010c | 14/ 1/12 | 149 | 0001500d | 0/21/13 |
| 22 | fffb030b | -5/ 3/11 | 86 | fff2010c | -14/ 1/12 | 150 | 0001600d | 0/22/13 |
| 23 | fffb030b | -5/ 3/11 | 87 | fff2010c | -14/ 1/12 | 151 | 0001700d | 0/23/13 |
| 24 | 0006020b | 6/ 2/11 | 88 | 0000020c | 0/ 2/12 | 152 | 0001800d | 0/24/13 |
| 25 | 0006020b | 6/ 2/11 | 89 | 0000020c | 0/ 2/12 | 153 | 0001900d | 0/25/13 |
| 26 | 0006020b | 6/ 2/11 | 90 | 0000030c | 0/ 3/12 | 154 | 0001a0d | 0/26/13 |
| 27 | 0006020b | 6/ 2/11 | 91 | 0000030c | 0/ 3/12 | 155 | 0001b0d | 0/27/13 |
| 28 | fffa020b | -6/ 2/11 | 92 | 0000040c | 0/ 4/12 | 156 | 0001c0d | 0/28/13 |
| 29 | fffa020b | -6/ 2/11 | 93 | 0000040c | 0/ 4/12 | 157 | 0001d0d | 0/29/13 |
| 30 | fffa020b | -6/ 2/11 | 94 | 0000050c | 0/ 5/12 | 158 | 0001e0d | 0/30/13 |
| 31 | fffa020b | -6/ 2/11 | 95 | 0000050c | 0/ 5/12 | 159 | 0001f0d | 0/31/13 |
| | | | | | | 192 | 00000000 | 0/ 0/ 0 |
| | | | | | | 193 | 00000000 | 0/ 0/ 0 |
| | | | | | | 194 | 00000000 | 0/ 0/ 0 |
| | | | | | | 195 | 00000000 | 0/ 0/ 0 |
| | | | | | | 196 | 00000000 | 0/ 0/ 0 |
| | | | | | | 197 | 00000000 | 0/ 0/ 0 |
| | | | | | | 198 | 00000000 | 0/ 0/ 0 |
| | | | | | | 199 | 00000000 | 0/ 0/ 0 |
| | | | | | | 200 | 00000000 | 0/ 0/ 0 |
| | | | | | | 201 | 00000000 | 0/ 0/ 0 |
| | | | | | | 202 | 00000000 | 0/ 0/ 0 |
| | | | | | | 203 | 00000000 | 0/ 0/ 0 |
| | | | | | | 204 | 00000000 | 0/ 0/ 0 |
| | | | | | | 205 | 00000000 | 0/ 0/ 0 |
| | | | | | | 206 | 00000000 | 0/ 0/ 0 |
| | | | | | | 207 | 00000000 | 0/ 0/ 0 |
| | | | | | | 208 | 00000000 | 0/ 0/ 0 |
| | | | | | | 209 | 00000000 | 0/ 0/ 0 |
| | | | | | | 210 | 00000000 | 0/ 0/ 0 |
| | | | | | | 211 | 00000000 | 0/ 0/ 0 |
| | | | | | | 212 | 00000000 | 0/ 0/ 0 |
| | | | | | | 213 | 00000000 | 0/ 0/ 0 |
| | | | | | | 214 | 00000000 | 0/ 0/ 0 |
| | | | | | | 215 | 00000000 | 0/ 0/ 0 |
| | | | | | | 216 | 00000000 | 0/ 0/ 0 |
| | | | | | | 217 | 00000000 | 0/ 0/ 0 |
| | | | | | | 218 | 00000000 | 0/ 0/ 0 |
| | | | | | | 219 | 00000000 | 0/ 0/ 0 |
| | | | | | | 220 | 00000000 | 0/ 0/ 0 |
| | | | | | | 221 | 00000000 | 0/ 0/ 0 |
| | | | | | | 222 | 00000000 | 0/ 0/ 0 |
| | | | | | | 223 | 00000000 | 0/ 0/ 0 |

FIG.5A

TABLE 3 (cont.)

| index | RAB | Amp/Run/Bits | index | RAB | Amp/Run/Bits | index | RAB | Amp/Run/Bits | index | RAB | Amp/Run/Bits |
|---|---|---|---|---|---|---|---|---|---|---|---|
| 32 | 0009010b | 9/ 1/11 | 96 | 0002070c | 2/ 7/13 | 160 | 0000200d | 0/32/13 | 224 | 00000000 | 0/ 0/ 0 |
| 33 | 0009010b | 9/ 1/11 | 97 | fffe070d | -2/ 7/13 | 161 | 0000210d | 0/33/13 | 225 | 00000000 | 0/ 0/ 0 |
| 34 | 0009010b | 9/ 1/11 | 98 | 0002080d | 2/ 8/13 | 162 | 0000220d | 0/34/13 | 226 | 00000000 | 0/ 0/ 0 |
| 35 | 0009010b | 9/ 1/11 | 99 | fffe080d | -2/ 8/13 | 163 | 0000230d | 0/35/13 | 227 | 00000000 | 0/ 0/ 0 |
| 36 | fff7010b | -9/ 1/11 | 100 | 0002090d | 2/ 9/13 | 164 | 0000240d | 0/36/13 | 228 | 00000000 | 0/ 0/ 0 |
| 37 | fff7010b | -9/ 1/11 | 101 | fffe090d | -2/ 9/13 | 165 | 0000250d | 0/37/13 | 229 | 00000000 | 0/ 0/ 0 |
| 38 | fff7010b | -9/ 1/11 | 102 | 00020a0d | 2/10/13 | 166 | 0000260d | 0/38/13 | 230 | 00000000 | 0/ 0/ 0 |
| 39 | fff7010b | -9/ 1/11 | 103 | fffe0a0d | -2/10/13 | 167 | 0000270d | 0/39/13 | 231 | 00000000 | 0/ 0/ 0 |
| 40 | 000a010b | 10/ 1/11 | 104 | 0003070d | 3/ 7/13 | 168 | 0000280d | 0/40/13 | 232 | 00000000 | 0/ 0/ 0 |
| 41 | 000a010b | 10/ 1/11 | 105 | fffd070d | -3/ 7/13 | 169 | 0000290d | 0/41/13 | 233 | 00000000 | 0/ 0/ 0 |
| 42 | 000a010b | 10/ 1/11 | 106 | 0003080d | 3/ 8/13 | 170 | 00002a0d | 0/42/13 | 234 | 00000000 | 0/ 0/ 0 |
| 43 | 000a010b | 10/ 1/11 | 107 | fffd080d | -3/ 8/13 | 171 | 00002b0d | 0/43/13 | 235 | 00000000 | 0/ 0/ 0 |
| 44 | fff6010b | -10/ 1/11 | 108 | 0005040d | 5/ 4/13 | 172 | 00002c0d | 0/44/13 | 236 | 00000000 | 0/ 0/ 0 |
| 45 | fff6010b | -10/ 1/11 | 109 | fffb040d | -5/ 4/13 | 173 | 00002d0d | 0/45/13 | 237 | 00000000 | 0/ 0/ 0 |
| 46 | fff6010b | -10/ 1/11 | 110 | 0007030d | 7/ 3/13 | 174 | 00002e0d | 0/46/13 | 238 | 00000000 | 0/ 0/ 0 |
| 47 | fff6010b | -10/ 1/11 | 111 | fff9030d | -7/ 3/13 | 175 | 00002f0d | 0/47/13 | 239 | 00000000 | 0/ 0/ 0 |
| 48 | 000b010b | 11/ 1/11 | 112 | 0007020d | 7/ 2/13 | 176 | 0000300d | 0/48/13 | 240 | 00000000 | 0/ 0/ 0 |
| 49 | 000b010b | 11/ 1/11 | 113 | fff9020d | -7/ 2/13 | 177 | 0000310d | 0/49/13 | 241 | 00000000 | 0/ 0/ 0 |
| 50 | 000b010b | 11/ 1/11 | 114 | 0008020d | 8/ 2/13 | 178 | 0000320d | 0/50/13 | 242 | 00000000 | 0/ 0/ 0 |
| 51 | 000b010b | 11/ 1/11 | 115 | fff8020d | -8/ 2/13 | 179 | 0000330d | 0/51/13 | 243 | 00000000 | 0/ 0/ 0 |
| 52 | fff5010b | -11/ 1/11 | 116 | 0009020d | 9/ 2/13 | 180 | 0000340d | 0/52/13 | 244 | 00000000 | 0/ 0/ 0 |
| 53 | fff5010b | -11/ 1/11 | 117 | fff7020d | -9/ 2/13 | 181 | 0000350d | 0/53/13 | 245 | 00000000 | 0/ 0/ 0 |
| 54 | fff5010b | -11/ 1/11 | 118 | 000a020d | 10/ 2/13 | 182 | 0000360d | 0/54/13 | 246 | 00000000 | 0/ 0/ 0 |
| 55 | fff5010b | -11/ 1/11 | 119 | fff6020d | -10/ 2/13 | 183 | 0000370d | 0/55/13 | 247 | 00000000 | 0/ 0/ 0 |
| 56 | 0000000b | 0/ 0/11 | 120 | 000b020d | 11/ 2/13 | 184 | 0000380d | 0/56/13 | 248 | 00000000 | 0/ 0/ 0 |
| 57 | 0000000b | 0/ 0/11 | 121 | fff5020d | -11/ 2/13 | 185 | 0000390d | 0/57/13 | 249 | 00000000 | 0/ 0/ 0 |
| 58 | 0000000b | 0/ 0/11 | 122 | 000f010d | 15/ 1/13 | 186 | 00003a0d | 0/58/13 | 250 | 00000000 | 0/ 0/ 0 |
| 59 | 0000000b | 0/ 0/11 | 123 | fff1010d | -15/ 1/13 | 187 | 00003b0d | 0/59/13 | 251 | 00000000 | 0/ 0/ 0 |
| 60 | 0000010b | 0/ 1/11 | 124 | 0010010d | 16/ 1/13 | 188 | 00003c0d | 0/60/13 | 252 | 00000000 | 0/ 0/ 0 |
| 61 | 0000010b | 0/ 1/11 | 125 | fff0010d | -16/ 1/13 | 189 | 00003d0d | 0/61/13 | 253 | 00000000 | 0/ 0/ 0 |
| 62 | 0000010b | 0/ 1/11 | 126 | 0011010d | 17/ 1/13 | 190 | 00000000 | 0/ 0/ 0 | 254 | 00000000 | 0/ 0/ 0 |
| 63 | 0000010b | 0/ 1/11 | 127 | ffef010d | -17/ 1/13 | 191 | 00000000 | 0/ 0/ 0 | 255 | 00000000 | 0/ 0/ 0 |

FIG.5B

METHOD AND APPARATUS FOR VARIABLE LENGTH DECODING

FIELD OF THE INVENTION

The invention relates to image processing in general. More particularly, the invention relates to a method and apparatus for improving the decoding of variable length codes (VLCs) from a bitstream while reducing memory requirements for such decoding.

BACKGROUND OF THE INVENTION

Ever since the development of the first camera it seems that individuals have been interested in capturing an image for display on some sort of image media. One example is the demand for home and commercial videos. The emergence of personal computers (PCS) and computer networks has accelerated this interest. It is now possible for a video camera to capture images, transfer the images through a network, store the images on a PC, and play back the captured images on a PC monitor anywhere in the world. The capability to transfer and store image data on a PC is given, in part, by the use of compression technologies to reduce the large amount of digital data needed to reproduce an image with high levels of quality. One such compression technology was introduced by Sony Corporation titled "Specifications of Consumer-use Digital VCRs using 6.3 mm magnetic tape," December 1994, HD Digital VCR conference ("DV standard").

Conventional PCS, however, cannot adequately play back full motion videos compressed (sometimes referred to as "encoded") using the DV standard. The problem stems from the decoding algorithms used to decode the DV encoded video signals. For example, conventional DV decoding techniques implemented using a Pentium II microprocessor by Intel Corporation operating at 300 megahertz (MHZ) are only capable of playing back a DV encode video at 2–4 frames per second using a full size video window (e.g., 720×480 pixel resolution). Play back at 2–4 frames per second is far below industry standard for video quality, which is currently at 30 frames per second.

More particularly, conventional DV decoding algorithms have difficulty decoding the variable length codes generated by the DV encoding process. During the encoding process, video signals are compressed using two techniques referred to as run length encoding and variable length encoding.

Run length encoding takes a block of quantized coefficients and converts it to a series of "run" values and "amp" values. The block of quantized coefficients is really a matrix of zero and non-zero values. Run length encoding reduces the number of zeros by representing a series of zeros by a single number (ie., run value) followed by the non-zero value (ie., amp value). Each run and amp value represents a single code-pair, often referred to as a "run amp code" (RAC).

Variable length encoding converts each RAC into a VLC. One example of a variable length encoding technique is referred to as "Huffman encoding." Huffman encoding is a minimum length code. This means that given the statistical distribution of gray levels, Huffman encoding will generate a code word that is as close as possible to the minimum bound (the entropy). The resulting code words are of unequal length, hence the term VLC.

The result of the encoding process is a stream of bits having a zero value or a one value ("bitstream"). During the decoding process, the play back system receives the bitstream, determines the number of bits comprising each VLC, and transforms the VLC back into its corresponding RAC ("VLC decoding"). Conventional DV decoders, however, cannot accomplish VLC decoding fast enough to provide high quality play back of the decoded video signals.

For example, some conventional DV decoders use a simple translation table to perform VLC decoding. These systems read the encoded bit stream into a buffer one bit at a time and test the buffer after reading each bit to determine whether the buffer contains a complete code that can be decoded or whether another bit needs to be read. Once the buffer contains a complete VLC, the decoder looks up the VLC in a lookup table and retrieves a matching RAC. Such a method, however, requires a large number of processing cycles and a large memory to store the relatively large translation table.

Another method for VLC decoding is described in U.S. Pat. No. 5,646,618 (the "Walsh patent"). The VLC decoder reads K bits at a time into a buffer. The K bits are used as an index into a lookup table to retrieve a table entry from the lookup table. The lookup table has a table entry for each possible K-bit value. Each table entry indicates whether there are any complete VLCs at the start of the K bits and, if so, the table entry also indicates the decoded values for one, two or three VLCs. The table entry also indicates the total number of bits used to encoded the one, two or three VLCs. If the VLC is longer than K bits, additional J bits are retrieved from the bit stream and are used as an index into a second table having a table entry for each possible K+J bit value.

The technique described in the Walsh patent, however, suffers from the same problems as the bit-by-bit buffering technique described previously. The lookup tables described in the Walsh patent require a relatively large amount of memory i.e., 8 kilobytes). This increases hardware costs for the decoder. Moreover, the search algorithm for these lookup tables is fairly complex and therefore expensive in terms of processing cycles.

In view of the foregoing, it can be appreciated that a substantial need exists for a method and apparatus for VLC decoding that solves the above-mentioned problems.

SUMMARY OF THE INVENTION

One embodiment of the present invention comprises a method and apparatus for decoding variable length encoded signals. A decoder receives an encoded bit stream. The decoder retrieves N bits from the bitstream. The decoder retrieves a first value from a first table using the N bits. The decoder retrieves a second value from a second table using the first value, and determines whether the second value is a valid code. If the second value is a valid code, the decoder parses the second value to retrieve a run value, an amp value and a code length value.

BRIEF DESCRIPTION OF THE DRAWINGS

FIG. 3(a) is a first table suitable for use with one embodiment of the invention.

FIG. 3(b) is a first continuation of the first table suitable for use with one embodiment of the invention.

FIG. 3(c)–(e) is a second continuation of the first table suitable for use with one embodiment of the invention.

FIG. 4 is a second table suitable for use with one embodiment of the invention.

FIG. 5(a) is a third table suitable for use with one embodiment of the invention.

FIG. 5(b) is a continuation of the third table suitable for use with one embodiment of the invention.

DETAILED DESCRIPTION

One embodiment of the invention provides a video decoder for a video playback system capable of displaying high-quality, full-motion digital video images on a graphics display monitor in a PC environment that does not require any additional hardware. The video playback system is capable of accessing an encoded video bitstream from a mass storage device or receiving the encoded video bitstream from a remote source (e.g., a video camera or network), decoding the bitstream on the host processor, and displaying the decoded video on a display monitor.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
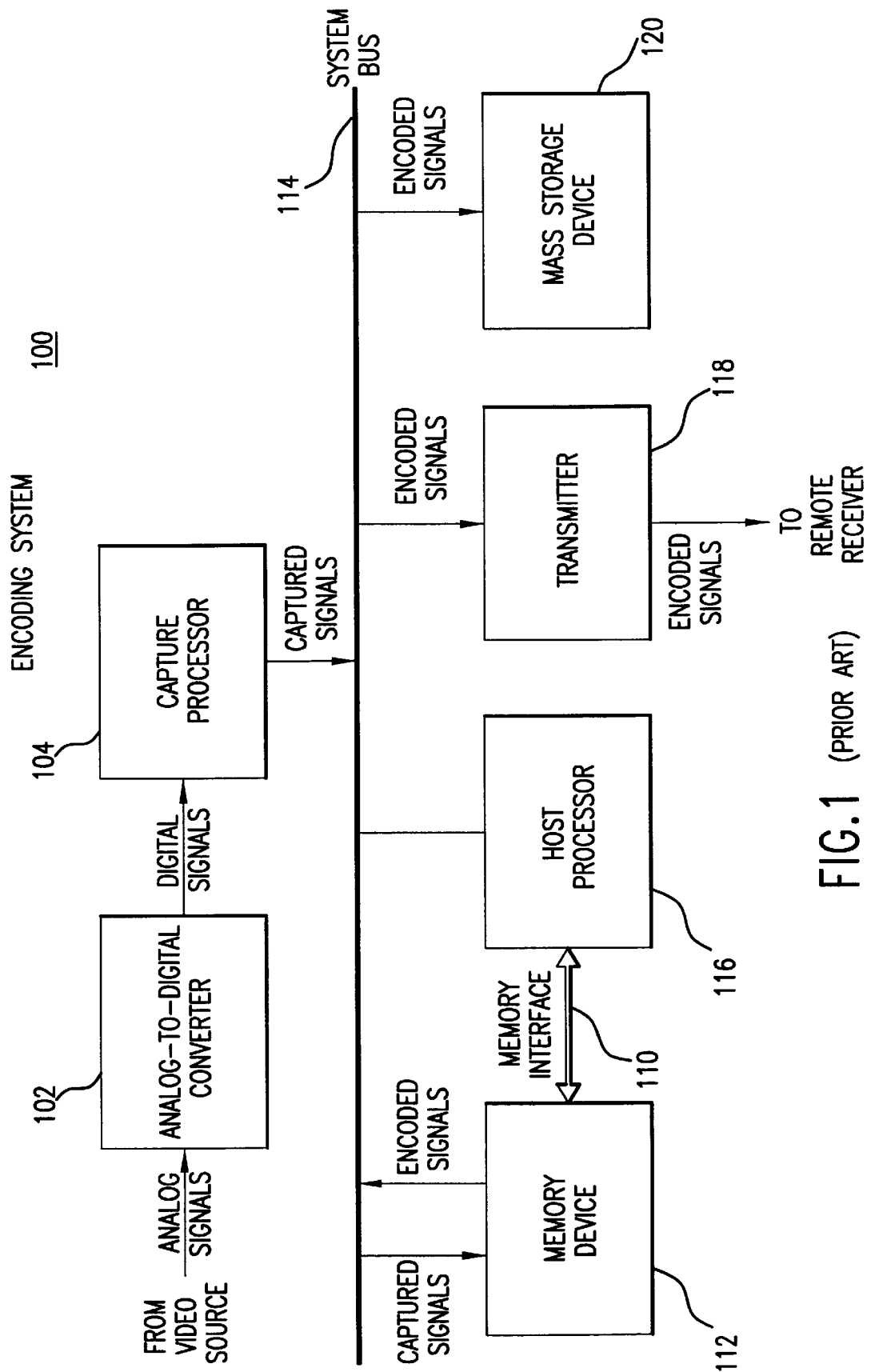
FIG. 1 illustrates a conventional video coder that produces a DV encoded signal.

FIG. 1 illustrates a conventional video coder that produces an encoded signal. An encoding system 100 includes an analog-to-digital (A/D) converter 102 that receives analog video signals from a video source. The video source may be any suitable source of analog video signals such as a video camera or video camera recorder (VCR) for generating local analog video signals or a video cable or antenna for receiving analog video signals from a remote source. A/D converter 102 decodes (i.e., separates the signal into constituent components) and digitizes the analog video signals into digital video component signals.

Capture processor 104 captures the digitized component signals received from converter 102. Capturing may include one or more of color conversion, scaling, and subsampling. Capture processor 104 selectively stores the captured signals to memory device 112 and/or mass storage device 120 via system bus 114. Those skilled in the art will understand that, for real-time encoding, the captured signals are preferably stored to memory device 112, while for non-real-time encoding, the captured signals are preferably stored to mass storage device 120.

During real-time encoding, host processor 116 reads the captured bitmaps from memory device 112 via high-speed memory interface 110 and generates encoded video signals that represent the captured video signals. Host processor 116 applies a sequence of compression steps in accordance with one of a variety of standards, such as the DV standard, to reduce the amount of data used to represent information in the video signals. For exemplary purposes only, the compression steps used by encoding system 100 adhere to those set forth in the DV standard.

Once video signals are DV encoded, the DV encoded video signals are then stored to memory device 112 via memory interface 112 and/or mass storage device 120 via system bus 114. Host processor 116 may copy the encoded video signals to mass storage device 120 and/or transmit the encoded video signals to transmitter 118 for real-time transmission to a remote receiver (not shown in FIG. 1).

Figure 2:
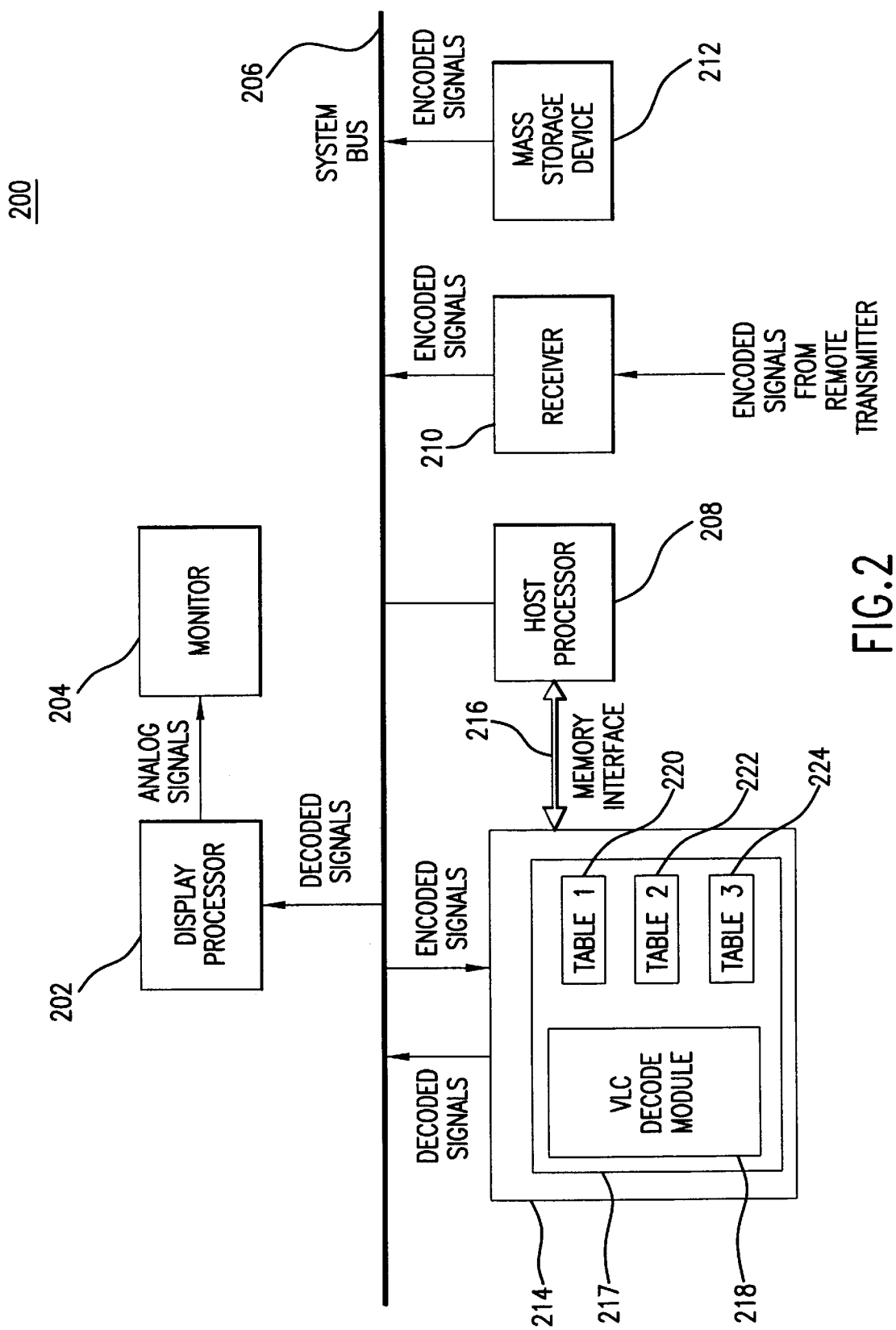
FIG. 2 illustrates a video decoder that decodes a DV encoded signal in accordance with one embodiment of the invention.

FIG. 2 illustrates a computer system for decoding DV encoded video signal according to one embodiment of the present invention. The DV encoded video signals could be, for example, signals encoded by encoding system 100. The encoded video signals are either read from mass storage device 212 of a decoding system 200 or received by receiver 210 from a remote transmitter, such as transmitter 118 of FIG. 1. The encoded video signals are stored to memory device 214 via system bus 206.

A host processor 208 accesses the encoded signals stored in a memory device 214 via a high-speed memory interface 216 and decodes the encoded video signals for display. Decoding the encoded video signals involves undoing the compression processing implemented by encoding system 100 of FIG. 1. Host processor 208 stores the decoded video signals to memory device 214 via memory interface 216 from where they are transmitted to a display processor 202 via a system bus 206. Alternatively, host processor 208 transmits the decoded video signals directly to display processor 202 via system bus 206. Display processor 202 processes the decoded video signals for display on a monitor 204. The processing of display processor 202 includes digital-to-analog conversion of the decoded video signals. Depending upon the particular embodiment, each of these processing steps may be implemented by either host processor 208 or display processor 202.

In one advantageous embodiment of the invention, decoding system 200 is a microprocessor-based PC system. Memory device 214 may be any suitable computer readable memory device such as one or more dynamic random access memory (DRAM) devices. High-speed memory interface 216 may be any suitable means for interfacing between memory device 214 and host processor 226. Mass storage device 212 may be any suitable means for storing digital signals such as a computer hard drive or compact disc read-only memory drive (CD-ROM). Receiver 210 may be any suitable means for receiving digital signals from a remote transmitter, such as transmitter 118. Those skilled in the art will understand that the encoded video signals may be received over any suitable medium such as twisted-pair wire, co-axial cable, fiber optics, radio-frequencies, and so forth. Host processor 208 may be any suitable means for decoding encoded video signals and is preferably a general purpose microprocessor such as the Pentium®, Pentium Pro, or Pentium II made by Intel Corporation. System bus 206 may be any suitable digital signal transfer device and is preferably a peripheral component interconnect (PCI) bus. Display processor 202 may be any suitable device for processing video signals for display (including converting the digital video signals to analog video signals), such as implemented through a PC-based display system such as a video graphic array (VGA) or super VGA (SVGA) system. Monitor 204 may be any means for displaying analog signals, such as a VGA monitor.

In one embodiment of the invention, encoding system 100 of FIG. 1 and decoding system 200 of FIG. 2 are two distinct computer systems. In an alternative embodiment of the present invention, a single computer system comprising all of the different components of systems 100 and 200 may be used to encode and decode video signals. Those skilled in the art will understand that such a combined system may be used to display decoded video signals in real-time to monitor the capture and encoding of video signals.

In other alternative embodiments of the present invention, the video encode processing of an encoding system and/or the video decode processing of a decoding system may be assisted by a pixel processor or other suitable component(s)

to off-load processing from the host processor by performing computational intensive operations.

Memory device 214 stores a DV decoder 217. DV decoder 217 decodes the encoded video signals by undoing the compression processing implemented by, for example, encoding system 100 of FIG. 1. The first step in the decoding process for DV decoder 217 is the transformation of VLCs embedded in an unstructured and encoded bit stream into corresponding RACs. To accomplish this, DV decoder 217 uses a VLC decoder 218 and VLC tables 220, 222 and 224. In this embodiment of the invention, VLC decoder 218 is comprised of computer program segments that are stored in memory 214, which when executed by a processor (e.g., processor 208), implement the VLC decoding functionality described in more detail below using tables 220, 222 and 224. The operation of VLC decoder 218 will be described in further detail below with reference to FIG. 6, while the organization of tables 220, 222 and 224 will be described with reference to FIGS. 3($a$), 3($b$), 3($c$), 4, 5($a$) and 5($b$).

It is noted that module 218 is shown as a single module. It can be appreciated, however, that the functions performed by this module can be further separated into more modules or be distributed throughout the system, and still fall within the scope of the invention. Further, the functionality of this module may be implemented in hardware, software, or a combination of hardware and software, using well-known signal processing techniques.

VLC tables 220, 222 and 224 are organized to allow rapid decoding of VLCs into corresponding RACs. This embodiment of the invention is based on the recognition that some VLCs occur in an encoded bitstream more than others. This frequency of occurrence served as a basis for categorizing each VLC into one of three types: Type 1, Type 2 and Type 3. The frequency of occurrence by type is summarized as follows:

| Type | VLC Length | Frequency in Bitstream |
|------|------------|------------------------|
| 1    | 3–10 bits  | ~95%                   |
| 2    | 11–13 bits | ~3%                    |
| 3    | 16 bits    | ~2%                    |

Since Type 1 VLCs occur most frequently, these VLCs and their corresponding RACs are organized into tables 220 and 222. Type 2 VLCs and their corresponding RACs are organized into table 224. RACs for Type 3 VLCs are derived using a special parsing algorithm. The corresponding search algorithm for this embodiment of the invention searches tables 220 and 222 in a first pass, table 224 in a second pass, and implements the parsing algorithm, if necessary, in a third pass. The second pass is performed only if a complete code is not found in the first pass, and the third pass only if a complete code is not found in the second pass. Since those VLCs having the greatest frequency of occurrence are stored in tables 220 and 222, there is a high likelihood that the search algorithm will find the appropriate RAC during the first pass of the algorithm. Further, since tables 220 and 222 are subsets of the total possible VLCs, the first pass occurs faster than with tables organized using conventional methods. This creates enhanced performance of the search algorithm, and provides an increase in speed over conventional VLC decoding techniques. The search algorithm and parsing algorithm will be described later in more detail with reference to FIG. 6.

FIGS. 3($a$), 3($b$) and 3($c$) illustrate a first table suitable for use with one embodiment of the invention. VLC table 220 and VLC table 222 are both used to retrieve a RAC and a code length value (collectively referred to as a "RAB") for each Type 1 VLC. VLC table 220 includes a table entry of 1 byte for each possible N-bits (with N-bits represented in VLC table 1 by a variable "pcode"). Since Type 1 VLCs vary in code length between 3 and 10 bits, N is set to 10 bits in this embodiment of the invention (thereby allowing for the maximum size Type 1 VLC). Therefore, VLC table 220 has 1024 table entries of 1 byte each. The total bytes of memory for VLC table 220 equals 1 kilobyte (KB). There are, however, only 107 Type 1 VLCs. Thus, each of the 1024 possible entries in table 1 contains an index into a second table (VLC table 222) storing a RAB for each Type 1 VLC.

FIG. 4 is a second table suitable for use with one embodiment of the invention. VLC table 222 comprises 108 table entries of 4 bytes each, with entries 0 to 106 having a RAB for each Type 1 VLC, and entry 107 having a flag indicating that N bits do not form a complete code. The total bytes of memory for VLC table 222 equals 432 bytes.

It is worthy to note that the reason for the use of a two table scheme as described above reduces memory requirements for VLC decoder 218 since it avoids the necessity of storing a 32-bit RAB value for all 1024 table entries. It can be appreciated, however, that each of the 1024 table entries could contain an appropriate RAB rather than an index into table 2, and still fall within the scope of the invention. The memory requirements, however, would move from 1,456 bytes to over 4 KB of memory.

FIGS. 5($a$) and 5($b$) illustrate a third table suitable for use with one embodiment of the invention. VLC table 224 is used for Type 2 VLCs, of which there are 190. Therefore, VLC table 224 has 256 entries of four bytes each. The total bytes of memory for VLC table 224 equals 1 KB. For VLC table 224, entries 0 to 189 contain a RAB for each Type 2 VLC, and entries 190 to 255 contain a flag indicating that pcode is a Type 3 VLC, which in this embodiment of the invention is a 32-bit value of 0.

It is worthy to note that the memory requirements for the above three tables amounts to 2.4 KB. By way of contrast, conventional lookup tables used for VLC decoding such as those described in the Walsh patent require a minimum of 8 KB of memory. This represents a 70% decrease in memory requirements and associated hardware costs.

Once VLC tables 220, 222 and 224 are constructed, VLC decoder 218 searches two or all three of these tables for an appropriate RAB for each VLC retrieved from the encoded bitstream. The computer program segments comprising VLC decoder 218 can be generated in accordance with the following pseudo-code:

```
While (!OutofCodes) {
    Read 10 bits into pcode;
    FirstVal = Table1(pcode);
    RAB = Table2(FirstVal);
    If (RAB is a valid code, Type 1) {
        FillinDCT(Run, Amp);
        AdvanceBitstream(Bits Consumed);
    } else {
        Read 16 bits into pcode;
        RAB = Table3(pcode > > 3) & 0xFF);
        If (RAB is a valid code, Type 2) {
            FillinDCT(Run, Amp);
            AdvanceBitstream(Bits Consumed);
        } else {
            Run = 0;
            Sign = (pcode & 1) ? -1:+1;
            Amp = Sign * ((pcode > > 1) & 0xFF);
```

```
        FillinDCT(Run, Amp);
        AdvanceBitstream(16);
      }
    }
  }
}.
```

In addition to the above pseudo-code, a person of ordinary skill in the art will appreciate that VLC decoder 218 must also include the capability to handle end of buffer (EOB) and partial-buffer cases, as specific to the DV standard format. The operation of the above pseudo-code will be described with reference to FIG. 6.

Figure 6:
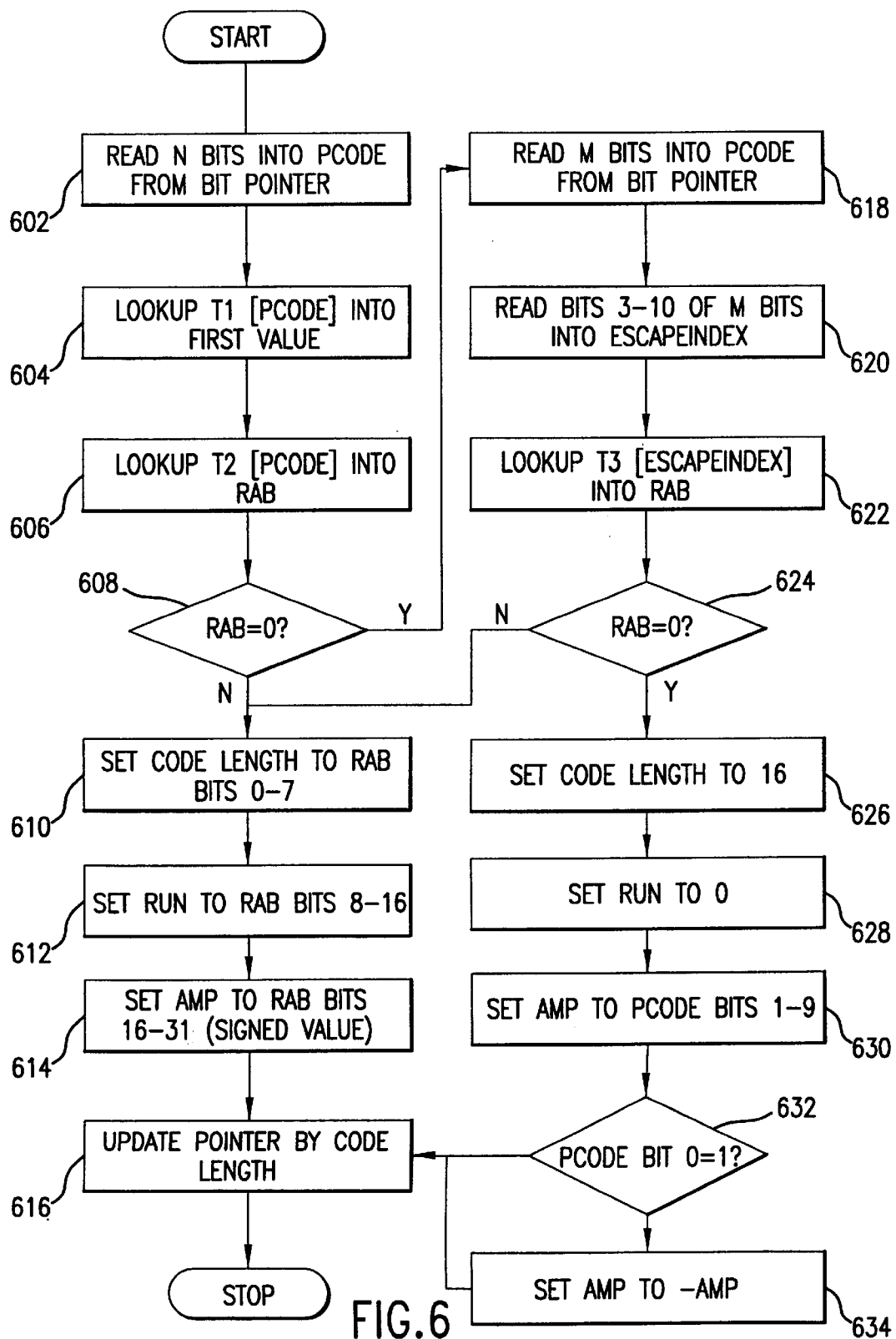
FIG. 6 is a block flow diagram of the steps performed by a VLC decoder in accordance with one embodiment of the invention.

FIG. 6 is a block flow diagram of the steps performed by a VLC decoder in accordance with one embodiment of the invention. As shown in FIG. 6, N-bits from a received bitstream starting with the bit indicated by a bit pointer are read into the variable pcode at step 602. The value pcode is used as an index to lookup a first value stored in VLC table 1 at step 604. The first value is used as an index to lookup a second value stored in VLC table 2 at step 606. The second value is read into a variable RAB and tested at step 608.

If RAB=0 at step 608, then pcode is not a Type 1 VLC and control is passed to step 618, where M-bits from the received bitstream starting with the bit indicated by the bit pointer are read into the variable pcode. Bits 3–10 of M-bits are used as an index to lookup a third value stored in VLC table 3 at step 622. The third value is read into the variable RAB and tested at step 624.

If the third value=0 at step 624, then pcode is not a Type 2 VLC. Since pcode is not a Type 1 or 2 VLC, then VLC decoder 218 assumes pcode is a Type 3 VLC and derives a RAB for pcode using a special algorithm. Since Type 3 VLCs are 16 bits in length, the code length value is set to 16. The run value is set to 0 at step 628, and the amp value is set to pcode bits 1–9 at step 630. Since pcode bits 1–9 represent an unsigned value, pcode bit 0 is checked at step 632. If pcode bit 0 equals 1 at step 632, then the bit pointer is updated by the code length at step 616. If pcode bit 0 does not equal 1 at step 632, then the sign for amp is reversed at step 634 and control is passed to step 616. It is worthy to note that in actual implementation steps 632 and 634 can be combined by assigning amp the value 2*amp*(pcode bit 0), and still fall within the scope of the invention.

If RAB does not equal 0 at step 624, then pcode is a Type 2 VLC and RAB is used to retrieve the run value, the amp value, and the code length value for the Type 2 VLC. The code length is set to RAB bits 0–7 at step 610. The run value is set to RAB bits 8–16 at step 612. The amp value is set to RAB bits 16–31 at step 614. Since RAB bits 16–31 represent a signed value, no additional tests need to be made as with the special algorithm described above. Control is then passed to step 616.

If RAB does not equal 0 at step 608, then pcode is a Type 1 VLC and RAB is used to retrieve the code length value, the run value, and the amp value for the Type 1 VLC in accordance with steps 610, 612 and 614, respectively. Control is then passed to step 616.

Although various embodiments are specifically illustrated and described herein, it will be appreciated that modifications and variations of the present invention are covered by the above teachings and within the purview of the appended claims without departing from the spirit and intended scope of the invention. For example, although the received bitstream in this embodiment of the invention was generated using encoding system 100, it can be appreciated that any DV encoded bitstream produced by any DV encoding system can be decoded using the principles described herein. Further, although this embodiment of the invention was described using a DV encoded bitstream, it can be appreciated that any bit steam representing encoded VLCs can be decoded using the principles described herein.

What is claimed is:

1. A method for decoding variable length encoded signals, comprising:

receiving an encoded bitstream;

retrieving N bits from the bitstream;

retrieving a first value from a first table using said N bits;

retrieving a second value from a second table using said first value;

determining whether said second value is a valid code; and parsing said second value to retrieve a run value, an amp value and a code length value if said second value is a valid code.

2. The method of claim 1, further comprising:

performing the following if said second value is not a valid code:

retrieving M bits from the bitstream;

retrieving a third value from a third table using a first subset of said M bits;

determining whether said third value is a valid code; and parsing said third value to retrieve said run value, said amp value and said code length value if said third value is a valid code.

3. The method of claim 2, further comprising parsing said M bits to retrieve said run value, said amp value and said code length value if said third value is not a valid code.

4. The method of claim 3, wherein said parsing said M bits comprises:

setting said code length value to M bits;

setting said run value to zero;

setting said amp value to a second subset of M bits; and determining a sign for said amp value.

5. The method of claim 4, wherein said N and M bits are retrieved from the bitstream using a pointer, and further comprising updating said pointer using said code length value.

6. The method of claim 5, wherein said encoded bit stream is received from a mass storage device.

7. The method of claim 5, wherein said encoded bit stream is received from a remote source.

8. A computer-readable medium whose contents cause a computer system to decode variable length encoded signals, by performing:

receiving an encoded bitstream;

retrieving N bits from the bitstream;

retrieving a first value from a first table using said N bits;

retrieving a second value from a second table using said first value;

determining whether said second value is a valid code; and parsing said second value to retrieve a run value, an amp value and a code length value if said second value is a valid code.

9. The computer-readable medium of claim 8, further performing the following if said second value is not a valid code:

retrieving M bits from the bitstream;

retrieving a third value from a third table using a first subset of said M bits;

determining whether said third value is a valid code; and parsing said third value to retrieve said run value, said amp value and said code length value if said third value is a valid code.

10. The computer-readable medium of claim 9, further performing parsing said M bits to retrieve said run value, said amp value and said code length value if said third value is not a valid code.

11. The computer-readable medium of claim 10, wherein said parsing said M bits comprises:

setting said code length value to M bits;

setting said run value to zero;

setting said amp value to a second subset of M bits; and determining a sign for said amp value.

12. The computer-readable medium of claim 11, wherein said N and M bits are retrieved from the bitstream using a pointer, and further performing updating said pointer using said code length value.

13. The computer-readable medium of claim 8, wherein said encoded bit stream is received from a mass storage device.

14. The computer-readable medium of claim 8, wherein said encoded bit stream is received from a remote source.

15. A DV decoder, comprising:

a memory containing:
  a first table;
  a second table;
  a third table;
  a VLC decoding program; and a processor for running the VLC decoding program using at least one of said first, second and third tables.

16. A decoding system decoding variable length encoded signals of an encoded bitstream, comprising:

a mass storage device storing the variable length encoded signals;

a memory coupled to said mass storage device, said memory containing:
  a first table;
  a second table;
  a third table;
  a VLC decoding program; and a processor coupled to said mass storage device and said memory for running the VLC decoding program to decode said stored variable length encoded signals.

17. A decoding system decoding variable length encoded signals of an encoded bitstream, comprising:

a receiver receiving the variable length encoded signals;

a memory coupled to said mass storage device, said memory containing:
  a first table;
  a second table;
  a third table;
  a VLC decoding program; and a processor coupled to said receiver and said memory for running the VLC decoding program to decode said received variable length encoded signals.

18. A computer data signal embodied in a carrier wave comprising:

a VLC decoding source code segment performing the steps of:

retrieving N bits from a bitstream;

retrieving a first value from a first table using said N bits;

retrieving a second value from a second table using said first value;

determining whether said second value is a valid code; and parsing said second value to retrieve a run value, an amp value and a code length value if said second value is a valid code.

* * * * *